US007463107B2

(12) United States Patent
Pittorino

(10) Patent No.: US 7,463,107 B2
(45) Date of Patent: Dec. 9, 2008

(54) RESONANT CIRCUIT AND OSCILLATOR HAVING A RESONANT CIRCUIT

(75) Inventor: Tindaro Pittorino, Marin (CH)

(73) Assignee: Infineon Technologies AG, Munich (DE)

( * ) Notice: Subject to any disclaimer, the term of this patent is extended or adjusted under 35 U.S.C. 154(b) by 107 days.

(21) Appl. No.: 11/516,334

(22) Filed: Sep. 6, 2006

(65) Prior Publication Data

US 2007/0085613 A1    Apr. 19, 2007

(30) Foreign Application Priority Data

Sep. 8, 2005    (DE) ...................... 10 2005 042 789

(51) Int. Cl.
*H03B 5/08* (2006.01)

(52) U.S. Cl. ............. 331/167; 331/117 FE; 331/177 V; 331/179

(58) Field of Classification Search ............... 331/36 C, 331/117 R, 117 FE, 167, 177 R, 177 V, 179
See application file for complete search history.

(56) References Cited

U.S. PATENT DOCUMENTS 5,739,730 A    4/1998  Rotzoll
6,859,112 B2*  2/2005  Mason ................. 331/117 FE
7,271,673 B2*  9/2007  Song .......................... 331/167
2005/0174184 A1  8/2005  Wu

FOREIGN PATENT DOCUMENTS

DE    103 92 359 T5    5/2005

OTHER PUBLICATIONS

"Solid State Electronic Devices", Ben G Streetman and Sanjay Banerjee, Fifth Edition, Prentice Hall 2000, 8 pgs.
"The Design of CMOS Radiofrequency Integrated Circuits", Field-Effect Transistors, Chapter 6, T. Lee, Edition 2004, 3 pgs.

* cited by examiner

*Primary Examiner*—Robert J. Pascal
*Assistant Examiner*—Ryan J. Johnson
(74) *Attorney, Agent, or Firm*—Eschweiler & Associates, LLC

(57) ABSTRACT

The invention is directed to a resonant circuit having a frequency-determining element which has at least one switchable frequency-changing element connected in parallel therewith. The frequency-changing element has two series-connected transistors whose control connections are connected to a node that receives a fixed potential. First connections of the two series-connected transistors are connected to one another and also to a control input for a control signal for switching the frequency-changing element of the resonant circuit. The invention keeps the control voltage for the two transistors at a higher potential than the threshold voltage for the transistors. This reduces a parasitic capacitance in the two transistors during operation.

18 Claims, 3 Drawing Sheets

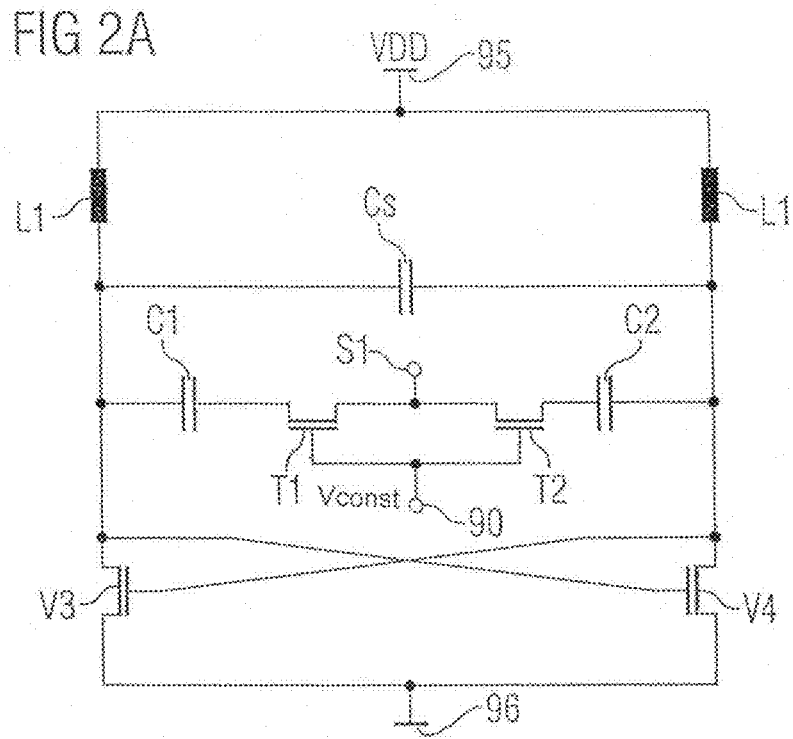
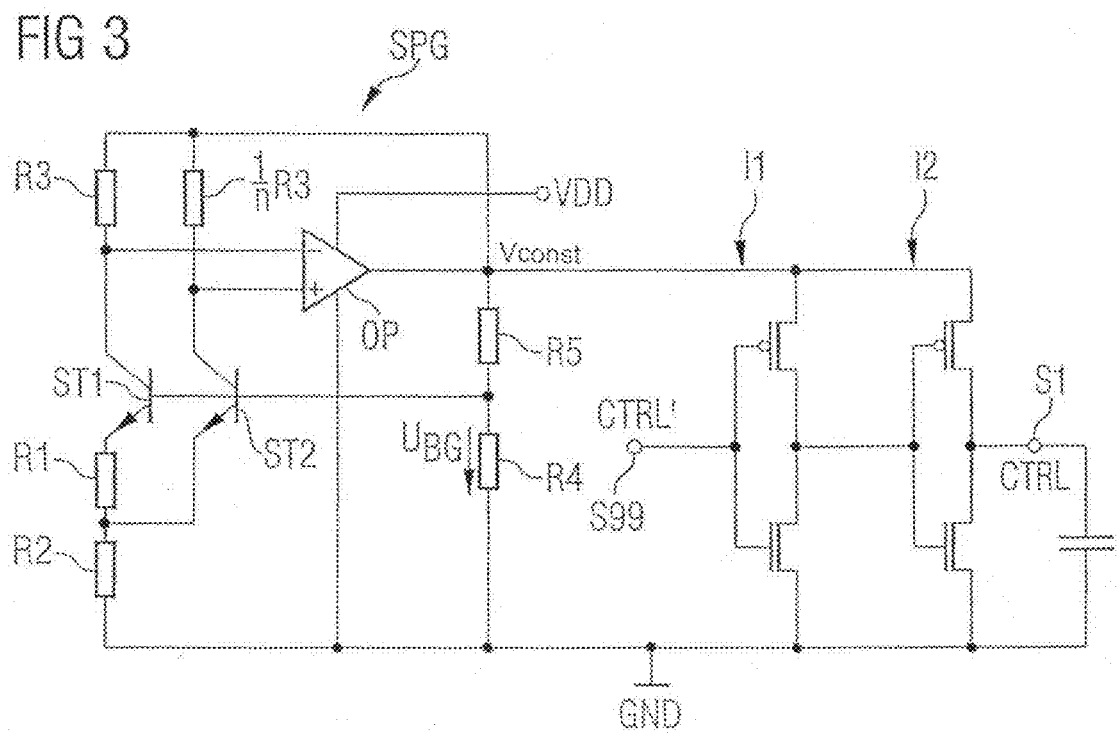

US 7,463,107 B2

RESONANT CIRCUIT AND OSCILLATOR HAVING A RESONANT CIRCUIT

REFERENCE TO RELATED APPLICATIONS

This application claims the benefit of the priority date of German application DE 10 2005 042 789.8, filed on Sep. 8, 2005, the contents of which are herein incorporated by reference in their entirety.

FIELD OF THE INVENTION

The invention relates to a resonant circuit and to an oscillator having a resonant circuit.

BACKGROUND OF THE INVENTION

Oscillators are used to produce an output signal at a particular frequency. The frequency of the output signal is dictated by the resonant frequency of a resonant circuit which is present in the oscillator. In this context, it is possible to use suitable measures to influence the resonant frequency of the resonant circuit by adding or disconnecting frequency-changing elements.

In general, a distinction is drawn in this context between a voltage controlled oscillator (VCO) and a digitally controlled oscillator (DCO). In voltage controlled oscillators, the frequency of the output signal is influenced by means of a continuously alterable DC voltage. The effect achieved by this is a uniform and continuous frequency change in the output signal. In a digitally controlled oscillator, a digital control word is taken as a basis for adding the frequency-changing elements to the resonant circuit or for removing them from it. This changes the output frequency of a digitally controlled oscillator in discrete-value steps.

FIG. 17.36, page 643, of the document by Thomas H. Lee: The Design of CMOS Radio-frequency integrated circuits, 2nd Edition 2004, shows a simple illustration of an oscillator at a fixed output frequency. This frequency is determined by the resonant circuit comprising the two coils L and the capacitance C.

Additional switchable frequency-changing elements allow the output frequency of the oscillator shown to be influenced. FIG. 5 shows a known resonant circuit having a frequency-changing element. In this case, the frequency-changing element comprises the two series-connected capacitors C1 and C2. These are arranged in parallel with the coil L1. The output nodes O1 and O2 are used to tap off a differential signal at the resonant frequency of the resonant circuit shown. Arranged between the two series-connected capacitors C1 and C2 of the frequency-changing element are the transistors T1 and T2. A first connection of each transistor is connected to a respective connection of one of the capacitors C1, C2. In addition, the first connections of the two transistors are connected to the ground potential connection M1 via a respective resistor R1. Similarly, the substrate connections of the two transistors T1 and T2 are coupled to the ground potential M1. The respective second connections of the transistors are coupled to one another.

The transistors T1 and T2 are used to switch the frequency-changing element into the resonant circuit during operation of the resonant circuit using a control signal on the control connections SC1, and in this way to alter the resonant frequency of the resonant circuit.

If the two transistors T1 and T2 have been switched to an on state, the transistors behave like resistors having low resistance values. The two capacitors C1, C2 have then been switched into the resonant circuit. If the capacitance values of the two capacitors C1 and C2 are the same, the total capacitance of the frequency-changing element is C/2. If the two transistors T1 and T2 have been switched to a nonconductive state, they behave like an open switch having a high nonreactive resistance. In such a case, the total capacitance is obtained through the following expression:

$$C_{tot} = \frac{1}{2} \frac{C * C_{par}}{C + C_{par}}$$

In this case, the capacitance value $C_{par}$ is a parasitic capacitance induced by the two transistors. This is a characteristic of the transistors used and is dependent on the design, the nature and the material of the transistors, for example. Since the transistors should have the lowest possible resistance in the closed state, known as the "on state", their dimensions are relatively large. It follows from this that the MOS field-effect transistors used usually also have large parasitic capacitances. This also reduces an effective capacitance change between the turned-on state, the "on state", and the turned-off state, the "off state".

There is therefore a need to make improvements to resonant circuits and oscillators.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

According to one embodiment of the invention, the resonant circuit comprises a frequency-determining element and also at least one switchable frequency-changing element arranged in parallel with the frequency-determining element. The frequency-changing element contains at least two series-connected transistors whose control connections are connected to a node configured to receive a fixed potential and whose first connections are connected to one another and also to a control input configured to receive a regulating signal for switching the frequency-changing element.

The invention improves resonant circuits by moving the control for switching the frequency-changing element from the control connections of the transistors to their source connections. At the same time, the control connections of the transistors are supplied with a fixed potential or with a control voltage. The latter can be derived from a regulated voltage.

This means that, in one embodiment of the invention, the voltage on the control connection is independent of the switching state of the transistors, and the switching state changes by virtue of a change in the voltage on one of the connections of the transistors and no longer on the control connection. Hence, a supplied control voltage on the control connection is substantially constant regardless of the switching state of the transistors. This novel actuation of the switch reduces the parasitic capacitances even when the transistors are in a turned-off state.

Advantageously, on one embodiment the absolute value of the difference between the firmly applied potential and the source potential of the two transistors in a connected state, the "on state", is greater than the absolute value of a threshold voltage for the transistors.

When the transistors are in a state representing an open switch, the "off state", the voltage on the control connection of the transistors relative to ground potential is likewise greater than the threshold voltage. Accordingly, in one embodiment the control voltage on the control connection is greater in terms of absolute value than the threshold voltage for the transistors of the switch.

In another embodiment of the invention, the frequency-changing element comprises two series-connected charge stores. These have the two series-connected transistors arranged between them. In one example, the two transistors comprise metal insulator field-effect transistors. Alternatively, the two transistors comprise metal oxide field-effect transistors. In another example, the transistors comprise JFE transistors (Junction-Field-Effect transistor) or HEM transistors (High Electron Mobility transistor). In these examples, the transistors may be either n-channel transistors or p-channel transistors. Overall, various embodiments of transistors and of the combination are conceivable and contemplated in order to bring about the inventive effect. Other transistor types are also suitable depending on the desired application.

In one embodiment of the invention, the two transistors respectively comprise a substrate connection which is connected to a reference potential. This may be the ground potential, for example. In another possible embodiment of the invention, the frequency-determining element may also comprise an inductance or a charge store having a fixed capacitance. The frequency-determining element may comprise part of an LC resonant circuit or also part of an RC resonant circuit.

In another embodiment of the invention, the regulating signal which can be supplied to the control input may have a first potential or at least one second potential. In this case, the first potential is the fixed potential. The at least one second potential is formed by the reference potential.

To provide a suitable regulating signal, it could be appropriate in one possible embodiment to couple the control input to an inverter circuit. The latter may be connected to a regulated voltage source, for example, whose output voltage is greater than the threshold voltage for the transistors. This produces a suitable regulating signal which is largely independent of fluctuations in the supply voltage.

To form an oscillator, a first tap and a second tap are also provided from which it is possible to tap off a differential oscillator signal during operation of the oscillator. Besides the resonant circuit, the oscillator may additionally comprise an amplifying element which is arranged in parallel with the frequency-determining element of the resonant circuit. The amplifying element may be designed to have a negative impedance which corrects damping brought about by the resonant circuit.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 2a is a schematic diagram illustrating another exemplary embodiment of an oscillator with a switchable frequency-changing element according to the invention;

FIG. 3 is a schematic diagram illustrating an exemplary embodiment of a driver circuit for producing the control signal according to the invention;

DETAILED DESCRIPTION OF THE INVENTION

Figure 1:
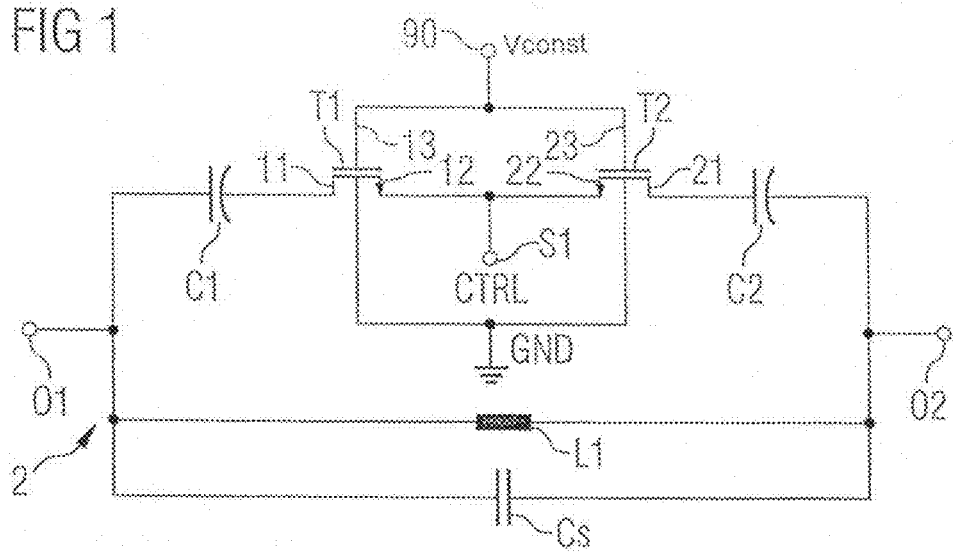
FIG. 1 is a schematic diagram illustrating an exemplary embodiment of an inventive resonant circuit according to the invention.

The invention is explained in detail below using exemplary embodiments with reference to the drawing. These show a summary of one or more aspects of the invention, but without limiting it to one specific form. A person skilled in the art can readily combine the embodiments shown with one another in different ways without this conflicting with the essence of the invention. The ratios of magnitudes for the elements relative to one another do not need to match but rather serve merely for the purpose of illustration. Identical elements in the various elements bear the same reference symbols.

FIG. 1 shows a possible embodiment of the inventive resonant circuit. In this case, the resonant circuit comprises a first frequency-determining element 2 having a coil L1 and also having a capacitor CS arranged in parallel therewith. The coil L1 and the capacitor CS respectively have two output taps O1 and O2 connected to them. These provide a differential signal during operation of the resonant circuit. In the steady state of the resonant circuit, the frequency of the differential signal corresponds to the resonant frequency which is determined by the frequency-determining element 2 and by the frequency-changing element 1.

The frequency-changing element 1 is likewise arranged in parallel with the frequency-determining element 2 and particularly with the coil L1 and the capacitor CS. The element 1 comprises two series-connected capacitors C1, C2 whose capacitance values are chosen to be of equal magnitude in the exemplary embodiment. The two capacitors C1 and C2 have the transistors T1, T2 arranged between them as switches. During operation of the resonant circuit, they act as switches and therefore switch the frequency-changing element into the resonant circuit or isolate the element 1 from the resonant circuit. This changes the total capacitance of the resonant circuit and hence the resonant frequency.

The two transistors T1, T2 have their respective first connections 11, 21 connected to the capacitors C1 and C2, respectively. The respective second connections 12, 22 of the transistors T1 and T2 are connected to the control input S1 for the switching operation with the control signal CTRL. The control connections 13, 23 are routed to the input 90.

During operation, the input 90 is supplied with a fixed potential. In the case of the n-MOS field-effect transistors shown here, this is the potential Vout, which can be provided by a regulated voltage source, for example, and is derived from a supply potential. By supplying the control signal CTRL on the control input S1, the transistors T1, T2 can be switched to a conductive or nonconductive state and hence the frequency-changing element 1 can be added to or disconnected from the resonant circuit. This means that the control connections are no longer used for regulating the switching response of the transistors T1 and T2, but rather the relevant source or sink connections thereof.

It will subsequently be assumed, as a nonrestrictive example for the purpose of illustration, that the transistors shown are in the form of n-channel field-effect transistors. In addition, the potential Vout is intended to be greater than the ground potential GND. If the control signal CTRL has now been pulled to the ground potential GND, for example, the voltage between the connections 13, 23 and 12, 22 when Vout has been chosen to be of suitable magnitude becomes greater than the threshold voltage $U_{TH}$ for the transistors. This means that the transistors form a conductive channel. The two transistors T1, T2 are in the conductive state, which is called the "on state".

On account of AC coupling by the two capacitors C1 and C2, no DC component flows through the frequency-changing element 1. Rather, the regulating input S1 acts as AC voltage ground. The transistors T1, T2 behave like simple resistors when in the conductive state, the resistance being dependent on the dimensions of the two transistors, particularly on the channel length and on the channel width.

If, by contrast, the control signal CTRL on the regulating input S1 is pulled to a high potential, for example the potential Vout, the two transistors T1, T2 behave like reverse-biased diodes. This destroys a conductive channel which has been formed, and the resistance of the structure increases greatly. The frequency-changing element 1 now behaves as though it were isolated from the rest of the resonant circuit.

The parasitic capacitance $C_{par}$ of a transistor is dependent on a change in the potential on the control connection or, when taking a ground potential as reference, for example, dependent on the voltage on the control connection. This dependency is shown in the graph shown in FIG. 4 for an MOS field-effect transistor having a p-doped substrate. The substrate forms the basic cell for an n-MOS field-effect transistor.

Figure 4:
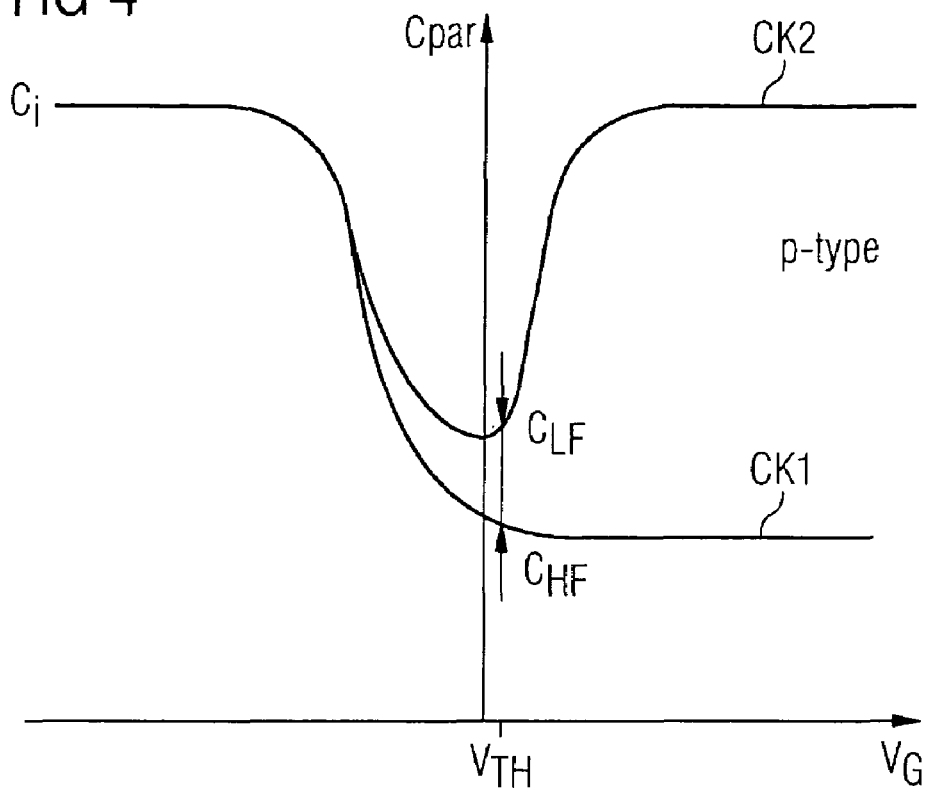
FIG. 4 is a graph illustrating a voltage/capacitance graph to explain the inventive principle in one embodiment of the present invention.

The curve CK1 in FIG. 4 shows the parasitic capacitance $C_{HF}$ of a transistor of this kind as a function of the voltage on the control connection $V_G$ for input signals at high frequencies on the source and sink connections. Accordingly, the curve CK2 depicts the profile of the parasitic capacitance $C_{LF}$ for low frequencies as a function of the control voltage $V_G$. For control voltages greater than the threshold voltage $V_{TH}$, the parasitic capacitance $C_{par}$ is low for high frequencies, while it increases again for low frequencies.

Since, in the case of the invention, the control connections of the transistors are always at a fixed potential whose absolute value is greater relative to the ground potential than an absolute value of the relevant threshold potential relative to the ground potential, a small parasitic capacitance is obtained for the transistors T1 and T2. In simplified terms, it is true that the firmly set gate or control voltage $V_G$ on the transistors is always greater in terms of absolute value than the threshold voltage $V_{TH}$. The term absolute value is to be understood to mean the value of the voltage or of the potential without an arithmetic sign.

Figure 5:
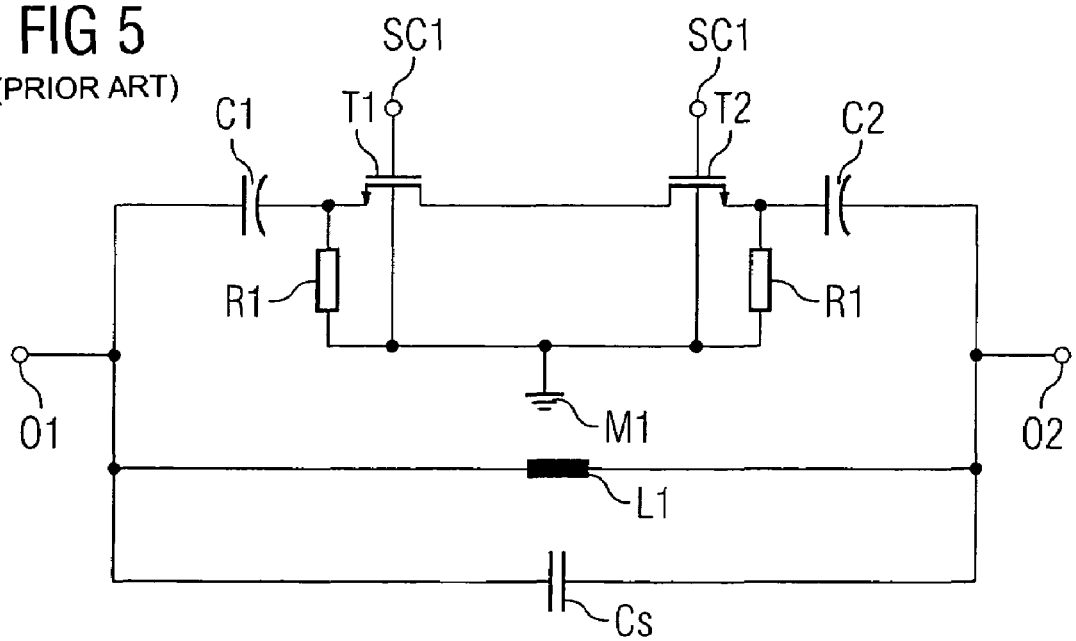
FIG. 5 is a schematic diagram illustrating a prior art resonant circuit with a frequency-changing element.

The lower parasitic capacitance $C_{par}$ is independent of the supplied control signal CTRL. In the case of the known exemplary embodiment in FIG. 5, the signal on the control connection SC1 changes. When the transistors T1 and T2 are in the nonconductive state in accordance with the known embodiment in FIG. 5, this results in the potential difference on the control connection relative to the ground potential being smaller than the threshold potential relative to the ground potential. This means that in the case of the known embodiment the control voltage $V_G$ when the transistors are in the nonconductive state is less than the threshold voltage $V_{TH}$. As can be seen from the graph in FIG. 4, the parasitic capacitance Ci increases again in the case of a small control voltage $V_G$.

The invention therefore prevents a disadvantageous change in the parasitic capacitance as a function of the switching state of the transistors T1 and T2 and allows a switch to be produced with a low parasitic capacitance which is independent of the switching state. Since the parasitic capacitances are now smaller at high frequencies, the dimensions of the capacitors C1 and C2 in the frequency-changing elements can be reduced and/or an inductance for the resonant circuit can be increased. Overall, the space requirement for the inventive resonant circuit is reduced. At the same time, however, the amplitude signal also becomes larger and hence the phase noise in the resonant circuit is improved.

For n-channel transistors, the control voltage used may be, by way of example, in the range from 0.8 V to 3.0 V, particularly in the range from 0.8 to 1.5 V, for example 1 V or 1.2 V. One possible and in no way restrictive voltage value on the control connection for p-channel transistors is 0 V.

The principle illustrated here can also be applied in the same way to p-channel field-effect transistors. In such a case, the control connections 13 and 23 of the two transistors T1 and T2 need to be put at a low potential, for example one that is negative relative to the ground potential GND. A conductive state for p-channel field-effect transistors is achieved with the control signal CTRL when it is pulled to the ground potential. For a nonconductive state, the control signal needs to be at a negative potential.

Depending on the chosen type of transistor, for example normally off, as shown here, or normally on, the channel type and other parameters, various modifications to the potentials and voltages which can be chosen are possible. What is fundamental, however, is that the control voltage is chosen such that it has a greater absolute value than the threshold voltage.

Figure 2:
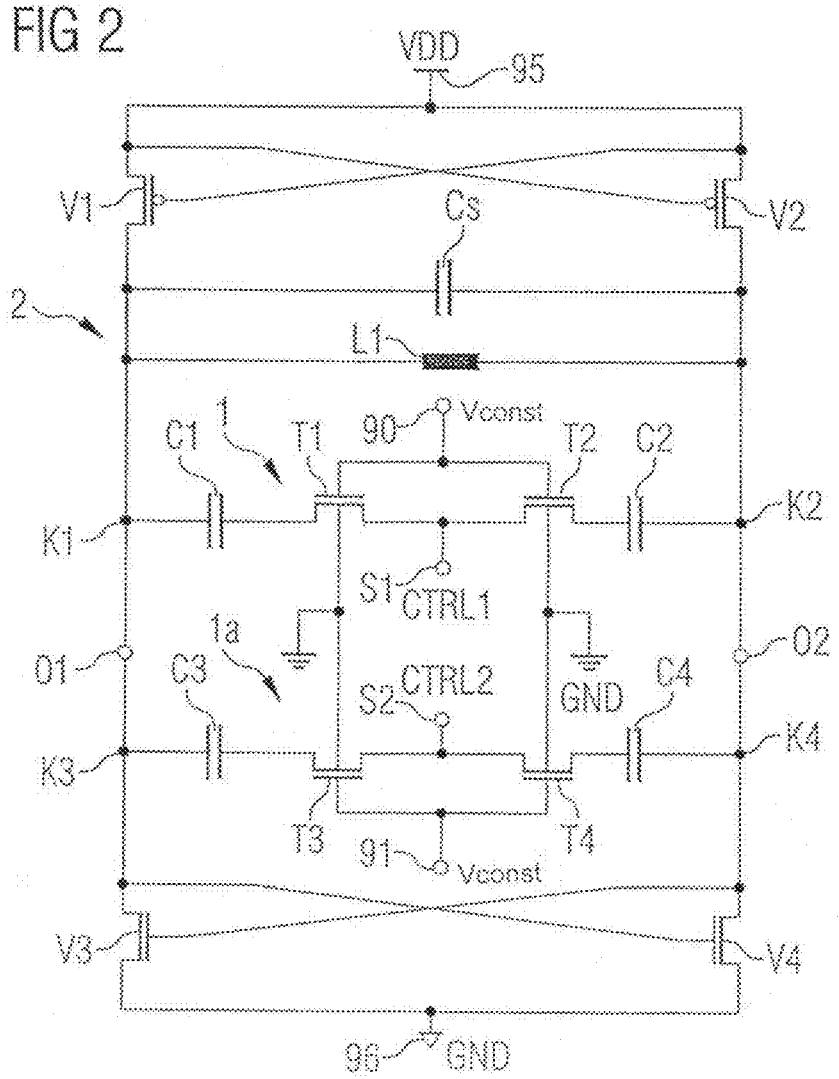
FIG. 2 is a schematic diagram illustrating a first exemplary embodiment of an oscillator with a plurality of switchable frequency-changing elements according to the invention.

FIG. 2 shows an embodiment of an oscillator with a resonant circuit and a plurality of frequency-changing elements therein. The frequency-changing elements 1, 1a are again arranged in parallel with the frequency-determining element 2 comprising the capacitance CS and the coil L1. The nodes K1 and K3 of the first and second frequency-changing elements 1, 1a have the output tap O1 provided between them. Accordingly, the output tap O2 is arranged between the nodes K2 and K4 of the frequency-changing elements 1, 1a.

Each of the frequency-changing elements 1, 1a contains two series-connected capacitors C1, C2 and C3, C4 whose capacitance values are respectively of the same magnitude. The capacitors C1 to C4 of the frequency-changing elements 1, 1a respectively have two field-effect transistors T1 to T4 arranged between them. During operation, their control connections are supplied with the regulated potential Vout, whose absolute value is greater than the relevant threshold potential for the transistors T1 to T4. The substrate connections of the individual transistors are in turn connected to a connection for the ground potential GND.

To change the frequency of the oscillator shown, the digital control word CTRL1 is supplied to the regulating inputs S1 or S2. Depending on the desired output frequency, this switches the transistors acting as switches to a conductive or nonconductive state. The frequency of an output signal on the taps O1, O2 changes as a result of the frequency-changing elements 1, 1a being added or disconnected.

To correct the damping or positive impedance of the resonant circuit comprising the frequency-determining element 2 and the frequency-changing elements 1, 1a, two negative impedance amplifiers are respectively provided. These respectively comprise a pair of cross-coupled field-effect transistors V1 to V4. Specifically, first connections of the p-channel field-effect transistors V1, V2 are connected to the supply input 95 for the purpose of supplying the supply potential VDD. Their control connections are connected to the second connection of the respective other transistor. Correspondingly, a second negative impedance amplifier having the n-channel field-effect transistors V3, V4 is connected between the ground potential connection 96 for the ground potential GND and the nodes K3, K4.

The oscillator which can be set in discrete values which is shown in FIG. 2 is used to produce output signals at four different frequencies. These can be set by the two-bit control signals CTRL1 and CTRL2. An appropriate further parallel circuit comprising additional frequency-changing elements allows the oscillator which can be tuned in discrete values to be extended. Depending on the desired frequency, the bits of the control signal CTRL1 or CTRL2 are switched to the logic state "low" or "high", which is done by signals at a low or high level. This supplies the control inputs S1, S2 either with the ground potential or with a second potential. In this context, it is possible for all additional capacitors C1, C2 and C3, C4 to have essentially the same capacitance values. It is likewise conceivable for these to be designed to have different capacitance values, so that two adjacent frequency-changing elements differ by the respective factor of 2, for example. This allows binary weighting of the individual frequency-changing elements.

The control inputs S1, S2 of the inventive resonant circuit form an AC voltage ground on account of the AC coupling and the differential tap. To reduce a noise component on the inputs S1, S2, it is possible to connect a further capacitor as a filter in addition.

FIG. 2a is another embodiment that shows a slightly modified refinement of an oscillator with a frequency-changing element in its resonant circuit. Components which have the same action or function bear the same reference symbols. In this embodiment, two coils L1 are connected in series with the capacitor Cs and, together with the latter, form the frequency-determining element.

This allows differential signal processing. In this case, just a single damping reduction amplifier having a transistor pair V3, V4 is provided, these being formed by n-channel field-effect transistors. The frequency-changing element with the two capacitors C1 and C2 which can be connected by means of the transistors T1, T2 is again arranged in parallel with the capacitor Cs.

FIG. 3 shows an embodiment of a driver circuit for providing the control signal CTRL. Components which have the same action or function again bear the same reference symbols. The driver circuit contains two inverter circuits I1, I2 which are arranged in succession. These respectively comprise two series-connected field-effect transistors of different channel type. The input connections of the second inverter circuit I2 are connected to the output of the first inverter circuit I1. The input connections of the first inverter circuit I1 are supplied with the actual control signal CTRL' on the regulating input S99.

To reduce possible voltage fluctuations and hence change the control signal CTRL at the output S1 of the second inverter circuit I2, these are fed by a bandgap reference voltage source. Instead of the bandgap reference, any other reference voltage source may also be used. The source shown comprises an operational amplifier OP whose output is connected to the inverter circuits I1 and I2. A portion of the output voltage Vout from the operational amplifier OP is returned to the base connections of the reference transistors ST1 and ST2 via the resistor R5. At the same time, the output voltage Vout is set using the ratio of the resistors R5 and R4.

At the same time, the actual reference voltage source can be operated by the transistors ST1 and ST2 from the output voltage Vout via the resistors R3 and R3'. Significantly better damping of possible input voltage fluctuations is obtained. With a suitable choice of resistors R1 and R2, the operational amplifier OP produces a constant output voltage Vout with low tolerances and low temperature dependencies. The output voltage Vout is likewise supplied to the inputs 90 and 91 of the resonant circuits shown in FIG. 1 and FIG. 2, 2a.

The inventive resonant circuit and the oscillator are particularly suitable for radio-frequency mobile applications, for example for providing a local oscillator signal in a phase locked loop in a transceiver. On account of the higher electron mobility, n-channel field-effect transistors offer lower resistance in the conductive state. Appropriate interchange of the potentials shown and a change in the control signals supplied to the control inputs allow p-channel field-effect transistors to be used.

In line with the invention, during operation of the resonant circuit, the control voltage is thus always kept above the threshold voltage in the case of n-channel field-effect transistors and is always kept below the threshold voltage in the case of p-channel field-effect transistors. This significantly reduces the parasitic capacitances in comparison with conventional resonant circuits in the case of signal frequencies in the range of 1 GHz and above. At the same time, the operating point is automatically set in a similar manner to operation in a diode.

Although the invention has been illustrated and described with respect to one or more implementations, alterations and/or modifications may be made to the illustrated examples without departing from the spirit and scope of the appended claims. In particular regard to the various functions performed by the above described components or structures (blocks, units, assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

The invention claimed is:

1. A resonant circuit, comprising:
    a frequency-determining element;
    at least one switchable frequency-changing element arranged in parallel with the frequency-determining element, wherein the frequency-changing element comprising:
        two series-connected transistors having gate terminals connected to a node configured to receive a fixed potential, and having second source or sink terminals connected to a control input configured to receive a control signal operable to selectively switch the frequency-changing element into or out of the resonant circuit;and two series-connected charge storage devices, wherein first source or sink terminals of the two series-connected transistors are respectively coupled to the two series-connected charge storage devices and wherein the first source or sink terminals of the two series-connected transistors are not coupled to one another by a transistor.

2. The resonant circuit of claim 1, wherein the two transistors comprise MOS transistors.

3. The resonant circuit of claim 1, wherein a difference between the fixed potential on the gate terminals and a reference potential is greater in terms of absolute value than a threshold voltage of the two transistors.

4. The resonant circuit of claim 1, wherein the transistors are of the n conductivity type, and a control signal on the control input is greater than a threshold voltage for the transistors when the transistors are in the off-state.

5. The resonant circuit of claim 1, wherein the transistors are of the p conductivity type, and a control signal on the control input is less than a threshold voltage for the transistors when the transistors are in the off-state.

6. The resonant circuit of claim 1, wherein the two transistors respectively have a substrate connection connected to a reference potential.

7. The resonant circuit of claim 1, wherein the frequency-determining element comprises an inductance.

8. The resonant circuit of claim 7, wherein the charge storage devices have a fixed capacitance coupled on parallel with the inductance.

9. The resonant circuit of claim 1, wherein the control signal has a first potential and at least one second potential, wherein the first potential is the fixed potential and the at least one second potential is a reference potential.

10. The resonant circuit of claim 1, further comprising a regulated voltage source configured to provide the fixed potential to the node.

11. The resonant circuit of claim 10, wherein the control input is coupled to an output of an inverter configured to supply the control signal, wherein the inverter is connected to the regulated voltage source at a voltage supply terminal thereof.

12. A resonant system, comprising:
a resonant circuit;
capacitive elements arranged in parallel with the resonant circuit;
a switch circuit comprising series-connected transistors having first source or sink terminals respectively coupled to the capacitive elements wherein the first source or sink terminals are not coupled to one another by a transistor, and configured to selectively switch the capacitive elements into the resonant circuit, wherein the transistors comprise two switching states, and wherein a voltage supplied to a gate terminal thereof is substantially constant and independent of the two switching states during a switching operation, and wherein a switching operation is effected by a control signal coupled to a first source or sink terminal between the series-connected transistors.

13. The resonant system of claim 12, wherein the voltage supplied to the control terminal is greater in terms of absolute value than a threshold voltage of the transistors.

14. The resonant system of claim 12, further comprising:
a first tap and a second tap coupled to opposite ends of the resonant circuit and configured to output a differential oscillator signal thereat; and
an amplifying element having a negative impedance arranged in parallel with the resonant circuit.

15. The resonant system of claim 14, wherein the amplifying element comprises at least one transistor pair having control terminals connected to a first connection of the respective other transistor in the pair, and having second terminals connected to a potential.

16. The resonant system of claim 14, further comprising a setting input configured to receive a digital setting signal for frequency setting of the resonant system, wherein the control signal is derived from the digital setting signal.

17. A resonant circuit, comprising:
a frequency-determining circuit configured to generate an oscillation signal at a frequency as a function of an inductance and capacitance associated therewith; and
a frequency-changing circuit operably coupled to the frequency-determining circuit, and configured to selectively alter the capacitance associated with the frequency-determining circuit, wherein the frequency-changing circuit comprises:
two series-connected transistors coupled together at a node having first source or sink terminals that are not coupled to one another by a transistor and having a gate terminal connected to a substantially fixed potential, and having a control signal coupled to the node;
capacitances respectively coupled to the series-connected transistors, wherein the capacitances and series-connected transistors are coupled in parallel with the frequency-determining circuit,
wherein the control signal is operable to selectively turn on and turn off the series-connected transistors, thereby altering the capacitance associated with the frequency-determining circuit, and
wherein the substantially fixed potential has an absolute value greater than a threshold voltage of the series-connected transistors.

18. The resonant circuit of claim 17, wherein when the series-connected transistors are turned off by the control signal, a capacitance associated with the frequency-changing circuit is a function of a parasitic capacitance of the series-connected transistors, and wherein the parasitic capacitance is a function of the substantially fixed potential at the gate terminals thereof.

* * * * *

UNITED STATES PATENT AND TRADEMARK OFFICE
CERTIFICATE OF CORRECTION

PATENT NO. : 7,463,107 B2 Page 1 of 1
APPLICATION NO. : 11/516334
DATED : December 9, 2008
INVENTOR(S) : Tindaro Pittorino It is certified that error appears in the above-identified patent and that said Letters Patent is hereby corrected as shown below:

Column 8, claim 1, lines 64 and 65: please change "comprising" to be --comprises--
Column 9, claim 8, line 33: please change "on" to be --in--
Column 10, claim 16, line 22: please change "selling" to be --setting--
Column 10, claim 16, line 23: please change "selling" to be --setting--

Signed and Sealed this

Seventeenth Day of February, 2009

JOHN DOLL
*Acting Director of the United States Patent and Trademark Office*